United States Patent
Kim et al.

(10) Patent No.: US 8,563,383 B2
(45) Date of Patent: Oct. 22, 2013

(54) METHOD OF MANUFACTURING A SEMICONDUCTOR DEVICE

(75) Inventors: Sang-Jin Kim, Suwon-si (KR);
Jong-Chan Shin, Seongnam-si (KR);
Yong-Kug Bae, Hwaseong-si (KR);
Myeong-Cheol Kim, Suwon-si (KR);
Do-Hyoung Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/252,621

(22) Filed: Oct. 4, 2011

(65) Prior Publication Data

US 2012/0122284 A1      May 17, 2012

(30) Foreign Application Priority Data

Nov. 11, 2010   (KR) .................. 10-2010-0111979

(51) Int. Cl.
*H01L 21/336*      (2006.01)

(52) U.S. Cl.
USPC ............... 438/287; 438/300; 257/E21.409

(58) Field of Classification Search
USPC .......... 438/287–799, 908, 915–925, 943–952
See application file for complete search history.

(56) References Cited

U.S. PATENT DOCUMENTS

| | | | | |
|---|---|---|---|---|
| 6,406,945 | B1* | 6/2002 | Lee et al. | 438/142 |
| 8,154,104 | B2* | 4/2012 | Shin et al. | 257/536 |
| 2006/0231903 | A1* | 10/2006 | Lee et al. | 257/377 |
| 2008/0296696 | A1 | 12/2008 | Yun et al. | |
| 2010/0127328 | A1* | 5/2010 | Oh et al. | 257/347 |
| 2010/0237504 | A1* | 9/2010 | Hong et al. | 257/758 |
| 2010/0267210 | A1* | 10/2010 | Seo et al. | 438/241 |
| 2011/0281379 | A1* | 11/2011 | Yang et al. | 438/16 |

FOREIGN PATENT DOCUMENTS

| | | | |
|---|---|---|---|
| KR | 10-2000-0015465 A | 3/2000 | |
| KR | 10-2001-0008523 A | 2/2001 | |

* cited by examiner

*Primary Examiner* — Telly Green
*Assistant Examiner* — Damian A Hillman
(74) *Attorney, Agent, or Firm* — Lee & Morse, P.C.

(57) ABSTRACT

A method of manufacturing a semiconductor device includes forming a plurality of gate structures including a metal on a substrate having an isolation layer, forming first insulating interlayer patterns covering sidewalls of the gate structures, forming first capping layer patterns and a second capping layer pattern on the gate structures and the first insulating interlayer patterns, the first capping layer patterns covering upper faces of the gate structures, and the second capping layer pattern overlapping the isolation layer, partially removing the first insulating interlayer patterns using the first and the second capping layer patterns as etching masks to form first openings that expose portions of the substrate, forming metal silicide patterns on the portions of the substrate exposed in the forming of the first openings, and forming conductive structures on the metal silicide patterns.

15 Claims, 6 Drawing Sheets

FIG. 12

METHOD OF MANUFACTURING A SEMICONDUCTOR DEVICE

CLAIM OF PRIORITY

Korean Patent Application No. 2010-111979, filed on Nov. 11, 2010 in the Korean Intellectual Property Office, "Semiconductor Device and Method of Manufacturing a Semiconductor Device," is incorporated by reference herein in its entirety.

BACKGROUND

Example embodiments relate to relate to a semiconductor device and a method of manufacturing a semiconductor device. More particularly, example embodiments relate to a semiconductor device having gate structures including a metal and a method of manufacturing a semiconductor device having gate structures including a metal.

SUMMARY

According to an embodiment, there is provided a method of manufacturing a semiconductor device including forming a plurality of gate structures including a metal on a substrate having an isolation layer, forming first insulating interlayer patterns covering sidewalls of the gate structures, forming first capping layer patterns and a second capping layer pattern on the gate structures and the first insulating interlayer patterns, the first capping layer patterns covering upper faces of the gate structures, and the second capping layer pattern overlapping the isolation layer, partially removing the first insulating interlayer patterns using the first and the second capping layer patterns as etching masks to form first openings that expose portions of the substrate, forming metal silicide patterns on the portions of the substrate exposed in the forming of the first openings, and forming conductive structures on the metal silicide patterns.

The substrate may include an active region and a field region, the field region being defined by the isolation layer. The second capping layer pattern may partially overlap the isolation layer adjacent to an outermost gate structure in the active region.

The active region may have a linear shape extending in a first direction. Each of the gate structures may have a linear shape extending in a second direction perpendicular to the first direction. Each of the first and the second capping layer patterns may have a linear shape extending in the second direction.

The forming of the gate structures may include forming gate spacers on the sidewalls of the gate structures. The first insulating interlayer patterns may cover sidewalls of the gate spacers. The first openings may be self-aligned relative to the gate spacers.

The first insulating interlayer patterns may be formed using silicon oxide. The first and the second capping layer patterns may be formed using silicon nitride.

The forming of the conductive structures may include forming second insulating interlayer patterns on the metal silicide patterns to fill the first openings, partially removing the second insulating interlayer patterns to form second openings exposing the metal silicide patterns, and forming the conductive structures on the metal silicide patterns to fill the second openings.

The forming of the gate structures may include forming gate spacers on the sidewalls of the gate structures. The conductive structures may be self-aligned relative to at least one of the gate spacers, the first capping layer patterns and the second capping layer pattern.

The method may further include forming impurity regions at upper portions of the substrate beneath the metal silicide patterns, the first openings exposing the impurity regions, and forming elevated source drain (ESD) layers between the impurity regions and the metal silicide patterns.

The forming of the gate structures may include forming a plurality of dummy gate structures on the substrate, forming a first insulating interlayer on the substrate to cover the dummy gate structures, forming the first insulating interlayer patterns by partially removing the first insulating interlayer until the dummy gate structures are exposed, partially removing the dummy gate structures to form recesses, and forming gate electrodes including metal in the recesses.

The dummy gate structures may include low-k dielectric layer patterns and dummy gate electrodes, and the recesses are formed by removing the dummy gate electrodes.

The method may further include forming high-k dielectric layer patterns on the low-k dielectric layer patterns and sidewalls of the recesses prior to forming the gate electrodes including metal.

According to another embodiment, there is provided a semiconductor device including a plurality of gate structures including metal disposed on a substrate having an isolation layer, first capping layer patterns covering upper faces of the gate structures, a second capping layer pattern overlapping the isolation layer, metal silicide patterns disposed on the substrate adjacent to the gate structures, and conductive structures disposed on the metal silicide patterns.

The semiconductor device may further include gate spacers disposed on sidewalls of the gate structures.

The semiconductor device may further include first insulating interlayer patterns disposed between the isolation layer and the second capping layer pattern, and second insulating interlayer patterns disposed between adjacent gate structures.

The semiconductor device may further include impurity regions disposed at upper portions of the substrate beneath the metal silicide patterns, and elevated source drain (ESD) layers disposed between the impurity regions and the metal silicide patterns.

According to an embodiment, there is provided a method of manufacturing a semiconductor device including providing a substrate, the substrate including a first region including an isolation layer and a second region including a plurality of dummy gates structures, the dummy gate structures each including a dummy gate electrode, sidewalls and gate spacers formed on the sidewalls, forming first insulation interlayer patterns in the first region and in the second region, one portion of the first insulation interlayer patterns covering the isolation layer and extending from the first region to cover a sidewall of a dummy gate structure closest to the first region, and remaining portions of the first insulation interlayer patterns extending between adjacent ones of the dummy gate structures and covering the sidewalls of adjacent gate structures, removing the dummy gate electrodes from the dummy gate structures to form recesses bounded by the gate spacers and filling the recesses with a metal to provide gate structures including a metal gate electrode, forming first capping layer patterns on an upper surface of the gate structures in the second region to cover each of the gate structures and a second capping layer pattern on the one portion of the first insulating interlayer patterns in the first region to overlap the isolation layer, wherein the first capping layer patterns expose portions of the first insulating interlayer patterns extending between adjacent ones of the gate structures and the second capping layer pattern exposes a portion of the first insulating interlayer patterns between the first region and a sidewall of the gate structure closest to the first region, partially removing the first insulating interlayer patterns using the first and the second capping layer patterns as etching masks to form first openings that expose portions of the substrate between adjacent ones of the gate structures and between the first region and the sidewall of the gate structure closest to the first region, the first openings being self-aligned relative to at least one of the gate spacers and wherein the one portion of the first insulating interlayer patterns covering the isolation layer is not removed, forming metal silicide patterns on the portions of the substrate exposed in the forming of the first openings, and forming conductive structures on the metal silicide patterns, wherein the conductive structures are self-aligned relative to at least one of the gate spacers.

The forming of the conductive structures may include forming second insulating interlayer patterns on the metal silicide patterns to fill the first openings, partially removing the second insulating interlayer patterns to form second openings exposing the metal silicide patterns, and forming the conductive structures on the metal silicide patterns to fill the second openings.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

It is to be understood that when an element or layer is referred to as being "on," another element or layer, it can be directly on the other element or layer or intervening elements or layers may be present. In contrast, when an element is referred to as being "directly on," another element or layer, there are no intervening elements or layers present. As used herein, the term "and/or" includes any and all combinations of one or more of the associated listed items.

It is to be understood that, although terms such as "first" and "second" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments will be more clearly understood from the following detailed description taken in conjunction with the accompanying drawings. FIGS. 1 to 12 represent non-limiting, example embodiments as described herein.

Figure 1:
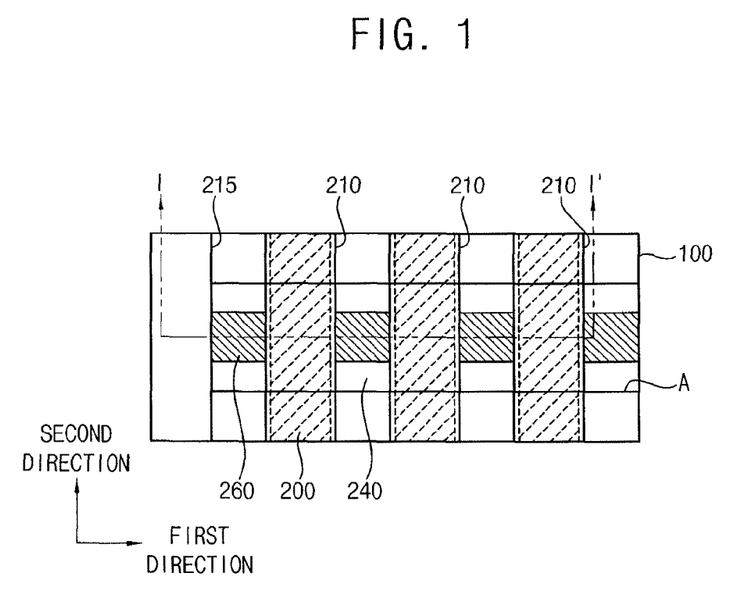
FIG. 1 illustrates a top view depicting a layout of capping layer patterns for manufacturing a semiconductor device in accordance with example embodiments.

FIG. 1 illustrates a top view depicting a layout of capping layer patterns for manufacturing a semiconductor device in accordance with example embodiments. FIGS. 2 to 12 illustrate cross-sectional views depicting a method of manufacturing a semiconductor device in accordance with example embodiments. FIGS. 2 to 12 are cross-sectional views illustrating the semiconductor device taken along a line I-I' in FIG. 1.

Figure 2:
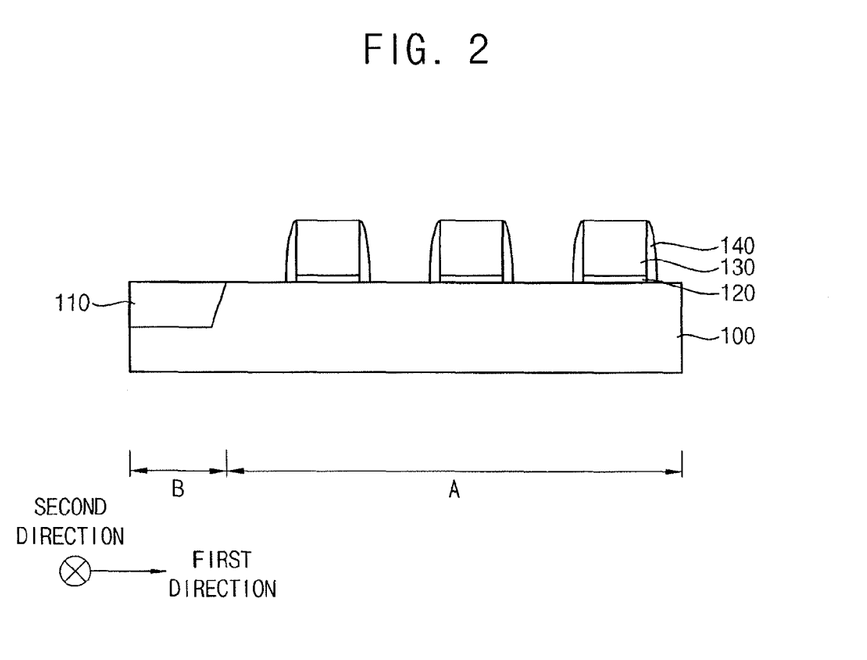
FIGS. 2 to 12 illustrate cross-sectional views of stages of a method of manufacturing a semiconductor device in accordance with example embodiments.

Referring to FIGS. 1 and 2, after forming an isolation layer 110 on a substrate 100, a plurality of dummy gate structures and a plurality of gate spacers 140 may be formed on the substrate 100 having the isolation layer 110.

The substrate 100 may include a semiconductor substrate. For example, the substrate 100 may include a silicon (Si) substrate, a germanium (Ge) substrate, a silicon-germanium (Si—Ge) substrate, a silicon-on-insulator (SOI) substrate, a germanium-on-insulator (GOI) substrate, etc. The substrate 100 may have a first region (A) and a second region (B), the second region (B) being defined by the isolation layer 110. The first region (A) of the substrate 100, in which the isolation layer 110 is not located, may be defined as an active region. The second region (B) of the substrate 100, in which the isolation layer 110 is positioned, may be defined as a field region. In example embodiments, the active region (A) of the substrate 100 may have a substantially linear shape extending along a first direction substantially parallel to an upper face of the substrate 100. The isolation layer 110 may be formed on the substrate 100 by an isolation process, for example, a shallow trench isolation (STI) process. The isolation layer 110 may be formed using silicon compound, for example, silicon oxide ($SiO_x$).

Each of the dummy gate structures may be obtained on the substrate 100 by sequentially forming a low-k dielectric layer pattern 120 and a dummy gate electrode 130 on the substrate 100 and the isolation layer 110.

In example embodiments, a low-k dielectric layer (not illustrated) and a dummy gate electrode layer (not illustrated) may be successively formed on the substrate 100 having the isolation layer 110. For example, the low-k dielectric layer may be formed on the substrate 100 and the isolation layer 110 using silicon oxide ($SiO_x$) by a chemical vapor deposition (CVD) process. The dummy gate electrode layer may be formed on the low-k dielectric layer by a CVD process, a plasma enhanced chemical vapor deposition (PECVD) process, etc. The dummy gate electrode layer may include polysilicon, amorphous silicon, etc. With an etching process using a hard mask or a photoresist pattern as an etching mask, the dummy gate electrode layer and the low-k dielectric layer may be partially etched, such that the dummy gate structures may be provided on the active region A of the substrate 100. Each of the dummy gate structures may include the low-k dielectric layer pattern 120 and the dummy gate electrode 130 successively stacked on the substrate 100. Adjacent dummy gate structures may be separated by a predetermined distance. Each of the dummy gate structures may extend in a second direction substantially parallel to the substrate 100. Additionally, the second direction may be substantially perpendicular to the first direction. That is, the dummy gate structures may extend in a direction substantially perpendicular to a direction where the active region (A) of the substrate 100 extends. However, the dummy gate structures may extend in the first direction whereas the active region (A) may extend along the second direction.

After forming a spacer formation layer (not illustrated) covering the dummy gate structures on the substrate 100 and covering the isolation layer 110, the spacer formation layer may be partially etched to form the gate spacers 140 on sidewalls of the dummy gate structures, respectively. The spacer formation layer may be formed using silicon nitride ($SiN_x$), silicon oxide, silicon oxynitride ($SiN_xO_y$), etc. The gate spacers 140 may be obtained by an anisotropic etching process.

Figure 3:
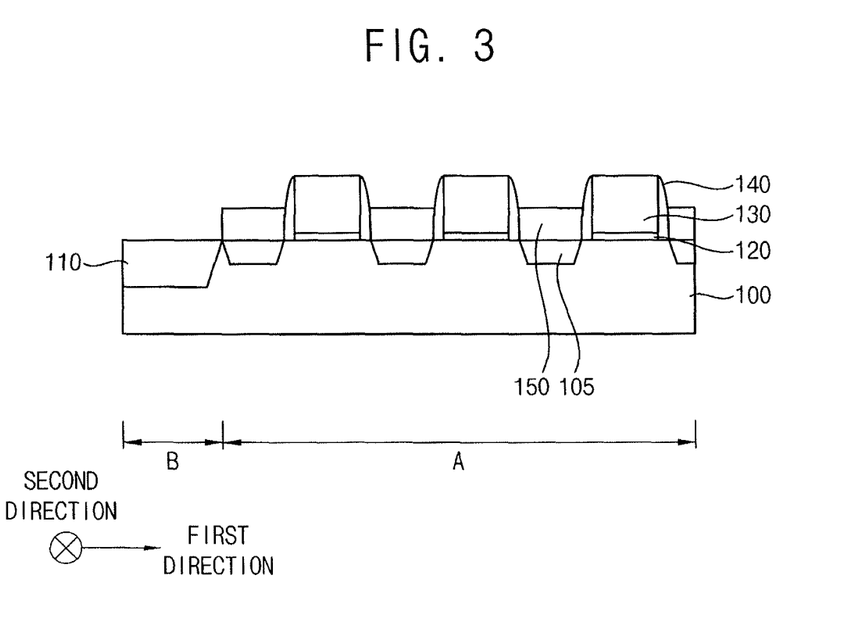

Referring to FIGS. 1 and 3, impurity regions 105 may be formed at upper portions of the substrate 100 between adjacent dummy gate structures. Elevated source drain (ESD) layers 150 may be formed on the impurity regions 105. For example, the impurity regions 105 may be respectively positioned among the dummy gate structures, and also the ESD layers 150 may be located on the impurity regions 105 among the dummy gate structures. Here, upper faces of the ESD layers 150 may be substantially lower than upper portions of the dummy gate structures and/or upper portions of the gate spacers 140. The ESD layers 150 may each have a height that is substantially lower than the height of the dummy gate structures and/or the height of gate spacers 140. However, each ESD layer 150 may have a thickness substantially larger than the thickness of the low-k dielectric layer patterns 120.

In example embodiments, portions of the active region (A) of the substrate 100 may be removed using the dummy gate structures and the gate spacers 140 as etching masks to form trenches (not illustrated) at the upper portions of the substrate 100 between adjacent dummy gate structures. The impurity regions 105 may be formed in the active region (A) to fill the trenches, respectively. In this case, each of the trenches may have a sidewall that is substantially inclined relative to the substrate 100. Thus, each impurity region 105 may also have a sidewall inclined by a predetermined angle with respect to the substrate 100.

In example embodiments, the impurity regions 105 may be formed in the trenches by a first selective epitaxial growth (SEG) process using a surface of the substrate 100 exposed by the trenches as a seed layer. The impurity regions 105 may be selectively grown on the substrate 100. For example, the first SEG process may include a chemical vapor deposition (CVD) process performed at a temperature in a range of about 500° C. to about 900° C. under a pressure in a range of about 0.1 Torr to a normal atmospheric pressure.

In the CVD process for forming the impurity regions 105 according to example embodiments, a source gas including a dichlorosilane ($SiH_2Cl_2$) gas or a germane ($GeH_4$) gas may be provided to form single crystalline silicon-germanium (Si—Ge) layers in the trenches on the substrate 100. In the CVD process, a p-type impurity source gas, for example, diborane ($B_2H_6$) gas may be additionally provided, so that single crystalline silicon-germanium layers doped with impurities may be formed in the trenches as the impurity regions 105.

In some example embodiments, the CVD process may be carried out using a source gas, for example, disilane ($Si_2H_6$) gas, methylsilane ($SiH_3CH_3$) gas, etc. Thus, single crystalline silicon carbide ($SiC_x$) layers may be formed in the trenches on the substrate 100. In the CVD process, an n-type impurity source gas, for example, a phosphine ($PH_3$) gas may be additionally provided such that single crystalline silicon carbide layers doped with impurities may be obtained as the impurity regions 105.

The ESD layers 150 may be formed on the impurity regions 105 by a second SEG process. The second SEG process may be carried out using the impurity regions 105 as seed layers. For example, the second SEG process may include a CVD process performed at a temperature in a range of about 500° C. to about 900° C. under a pressure in a range of about 0.1 Torr to a normal atmospheric pressure. The CVD process may be executed using a source gas such as dichlorosilane gas, and a p-type impurity source gas like diborane gas. Thus, single crystalline silicon layers doped with p-type impurities may be obtained as the ESD layers 150. The CVD process may also be carried out using an n-type impurity source gas such as phosphine gas instead of the p-type impurity source gas. In this case, single crystalline silicon layers doped with n-type impurities may be formed on the impurity regions 105 as the ESD layers 150.

In some example embodiments, the first SEG process for forming the impurity regions 105 and the second SEG process for forming the ESD layers 150 may be performed in situ. After providing a silicon source gas, a germanium source gas and a p-type impurity source gas to form the impurity regions 105 in the trenches on the substrate 100, the providing of the germanium source gas may be stopped such that the ESD layers 150 may be formed on the impurity regions 105 without a vacuum break. In another example embodiment, after providing a silicon source gas, a carbon source gas and an n-type impurity source gas to form the impurity regions 105 in the trenches, the providing of the carbon source gas may be stopped such that the ESD layers 150 may be formed on the impurity regions 105 without any vacuum break.

In some example embodiments, the process for forming the ESD layers 150 may be omitted as desired. The impurity regions 105 may be grown over the trenches or additional conductive layers including metal may be formed on the impurity regions 105.

Figure 4:
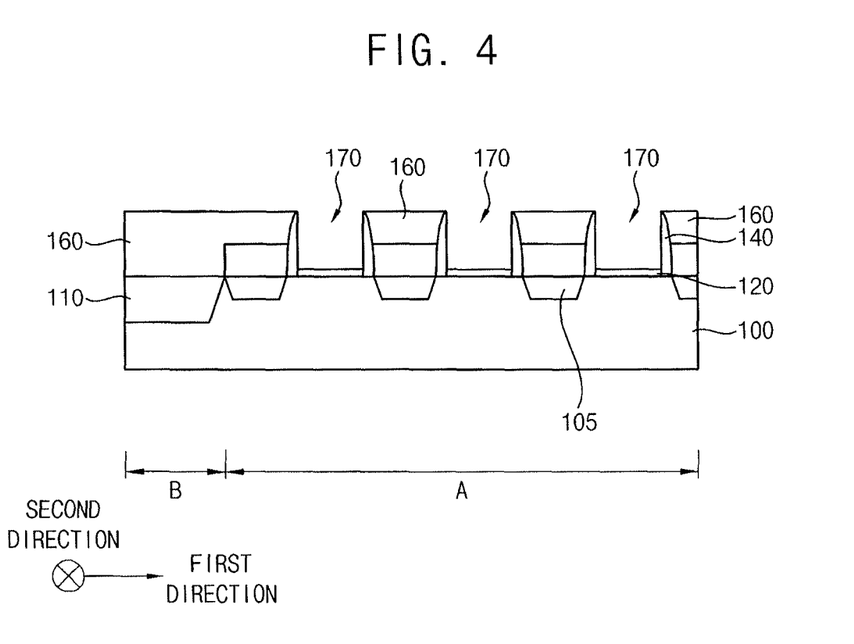

Referring to FIG. 4, a first insulating interlayer (not illustrated) may be formed on the substrate 100 and the isolation layer 110 to cover the dummy gate structures, the ESD layers 105 and the gate spacers 140. The first insulating interlayer may be formed using silicon compound such as silicon oxide. An upper portion of the first insulating interlayer may be partially removed such that the dummy gate electrodes 130 are exposed. Thus, first insulating interlayer patterns 160 may be formed on the ESD layers 150 and the isolation layer 110. That is, the first insulating interlayer patterns 160 may be provided in the active region (A) and the field region (B). For example, the first insulating interlayer patterns 160 may be obtained by a CMP process and/or an etch-back process. When the first insulating interlayer patterns 160 are formed on the isolation layer 110 and the ESD layers 150, the dummy gate electrodes 130 may be exposed between adjacent first insulating interlayer patterns 160.

The exposed dummy gate electrodes 130 may be removed from the low-k dielectric layer patterns 120, so that grooves or recesses 170 are provided on the low-k dielectric layer patterns 120, respectively. The recesses 170 exposing the low-k dielectric layer patterns 120 may be formed between adjacent gate spacers 140. For example, sidewalls of the recesses 170 may correspond to the gate spacers 140 and bottoms of the recesses 170 may correspond to the low-k dielectric layer patterns 120. The dummy gate electrodes 130 may be removed from the low-k dielectric layer patterns 140 by a wet etching process or a dry etching process.

Figure 5:
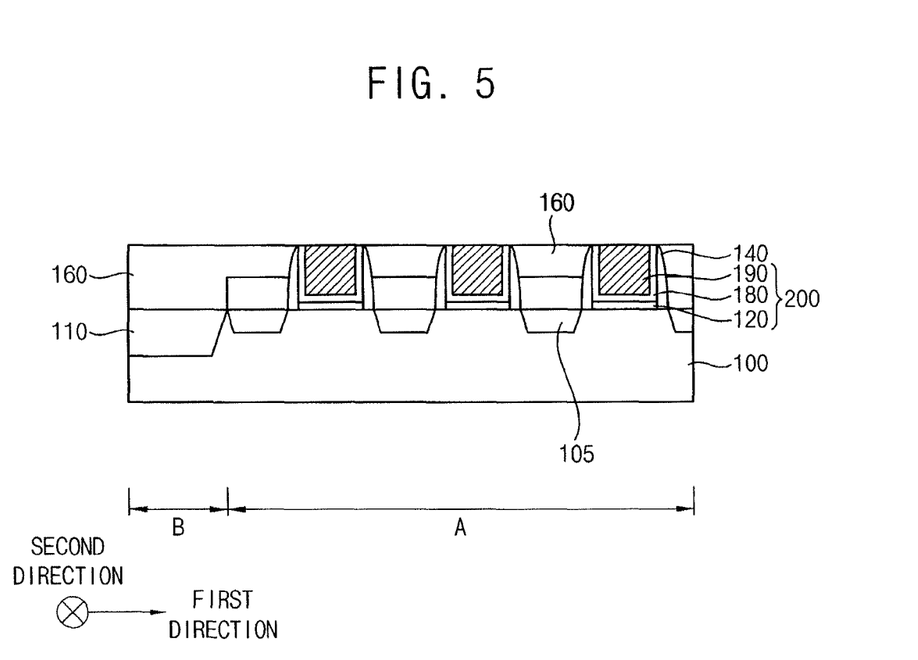

Referring to FIGS. 1 and 5, a high-k dielectric layer (not illustrated) may be formed on the sidewalls of the recesses 170 and the first insulating interlayer patterns 160. The high-k dielectric layer may partially fill the recesses 170. The high-k dielectric layer may be conformally formed along profiles of the recesses 170. A gate electrode layer (not illustrated) may be formed on the high-k dielectric layer to sufficiently fill the recesses 170.

In example embodiments, the high-k dielectric layer may be formed using a metal oxide having a relatively large dielectric constant. Examples of the metal oxide in the high-k dielectric layer may include hafnium oxide ($HfO_x$), tantalum oxide ($TaO_x$), aluminum oxide ($AlO_x$), zirconium oxide ($ZrO_x$), etc. The gate electrode layer may be formed using metal, metal nitride, metal silicide, etc. For example, the gate electrode layer may be obtained using aluminum (Al), tungsten (W), titanium (Ti), titanium nitride ($TiN_x$), aluminum nitride ($AlN_x$), tungsten nitride ($WN_x$), tungsten silicide ($WSi_x$), titanium silicide ($TiSi_x$), cobalt silicide ($CoSi_x$), nickel silicide ($NiSi_x$), platinum silicide ($PtSi_x$), etc. The gate electrode layer may be formed by an atomic layer deposition (ALD) process, a physical vapor deposition (PVD) process, etc. In some example embodiments, a heat treatment, for example, a rapid thermal annealing (RTA) process, a spike-RTA process, a flash RTA process or a laser annealing process may be additionally performed on the gate electrode layer to improve electric characteristics of the gate electrode layer.

Upper portions of the gate electrode layer and the high-k dielectric layer may be removed until the first insulating interlayer patterns 160 are exposed, so that high-k dielectric layer patterns 180 are formed on the low-k dielectric layer patterns 120 and on the sidewalls of the recesses 170. Further, gate electrodes 190 filling the recesses 170 may be formed on the high-k dielectric layer patterns 180. For example, the gate electrodes 190 and the high-k dielectric layer patterns 180 may be obtained by a CMP process and/or an etch-back process. As a result, gate structures 200 including a metal may be provided on the substrate 100. The gate structures 200 may include the low-k dielectric layer patterns 120, the high-k dielectric layer patterns 180 and the gate electrodes 190. The gate spacers 140 may be positioned on sidewalls of the gate structures 200. The low-k dielectric layer patterns 120 and the high-k dielectric layer patterns 180 may serve as gate insulation layer patterns of the gate structures 200 between the substrate 100 and the gate electrodes 190. Because the dummy gate structures may have substantially linear shapes extending in the second direction, the gate structures 200 also may have substantially linear shapes extending along the second direction. Additionally, transistors may be provided on the substrate 100 after forming the gate structures 200. Each of the transistors may include the gate structure 200, the impurity region 105 and the ESD layer 150.

In example embodiments, when the semiconductor device includes a dynamic random access memory (DRAM) device, the transistors may be formed in a logic region of the DRAM device.

Figure 6:
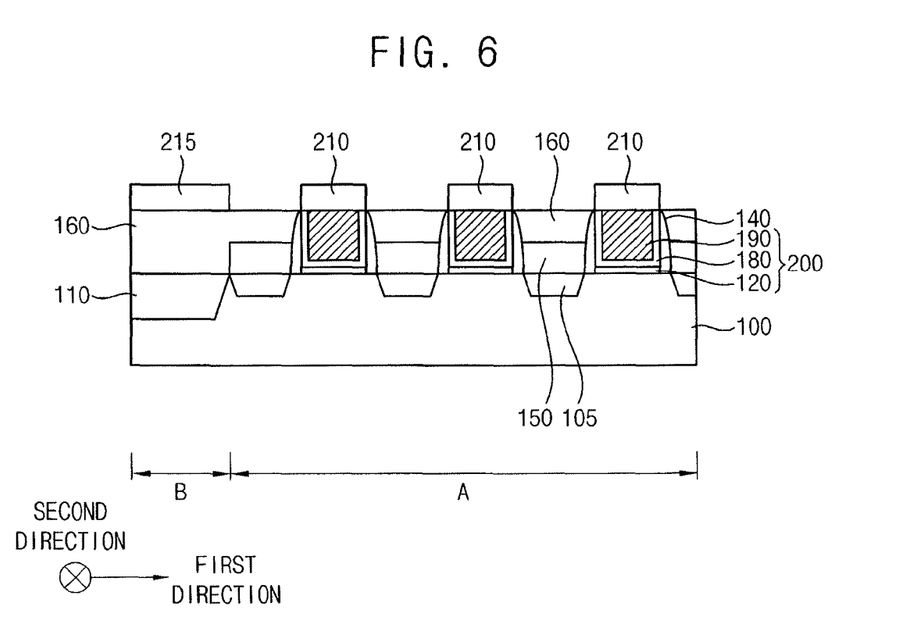

Referring to FIGS. 1 and 6, first capping layer patterns 210 and a second capping layer pattern 215 may be formed on the gate structures 200 and one of the first insulating interlayer patterns 160 in the field region (B). The first capping layer patterns 210 may cover the gate structures 200 in the active region (A), and the second capping layer pattern 215 may partially overlap with the underlying isolation layer 110 in the field region (B). The first insulating interlayer patterns 160 between adjacent gate structures 200 may be exposed after forming the first capping layer patterns 210. In the formation of the first and the second capping layer patterns 210 and 215, a capping layer (not illustrated) may be formed on the gate structures 200 and the first insulating interlayer patterns 160, and then the capping layer may be patterned by a photolithography process. For example, the capping layer may be formed using a material, for example, silicon nitride having a relatively high etching selectivity with respect to the first insulating interlayer patterns 160 the gate structures 200.

In example embodiments, each of the first capping layer patterns 210 may have a substantially linear shape extending along the second direction, so that each first capping layer pattern 210 may substantially cover each gate structure 200 while exposing adjacent first insulating layer patterns 160.

In example embodiments, the second capping layer pattern 215 may also have a substantially linear shape extending in the second direction substantially similar to the first capping layer patterns 210. However, the second capping layer pattern 215 may not cover the gate structures 200, and may be located over a portion of the isolation layer 110 adjacent to an outermost gate structure 200 positioned in the active region (A).

Figure 7:
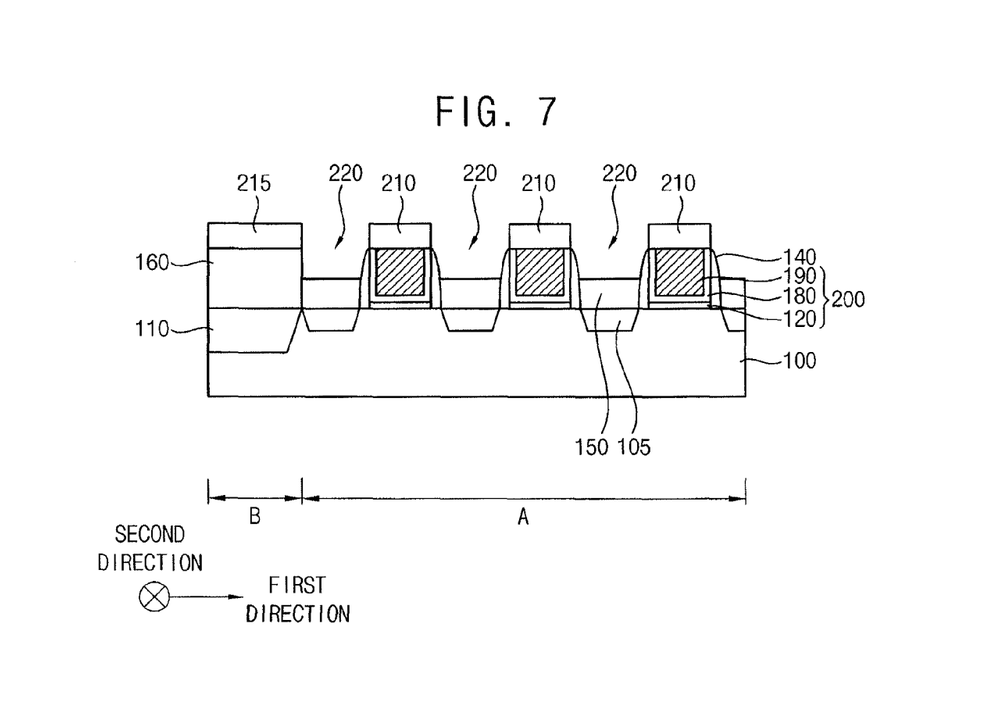

Referring to FIG. 7, the first insulating interlayer patterns 160 in the active region (A) may be removed from the ESD layers 150 using the first and the second capping layer patterns 210 and 215 as etching masks. Thus, first openings 220 partially exposing the ESD layers 150 and the isolation layer 110 may be formed in the active region (A). In formation of the first openings 220, the second capping layer pattern 215 may cover the first insulating interlayer pattern 160 in the second region (B), so that the first insulating interlayer pattern 160 may remain on the isolation layer 110 in the second region (B).

In example embodiments, the first openings 220 may be self-aligned with respect to the gate spacers 140 in the active region (A). However, the first openings 220 may not be provided in the field region (B) because of the second capping layer pattern 215 covering the first insulating interlayer pattern 160 in the field region (B). One of the first insulating interlayer patterns 160 that is adjacent to the outermost gate structure 200 and the isolation layer 110 may be protected by the second capping layer pattern 215 in the field region (B). Thus, when the first openings 220 are formed in the active region (A), damage to the first insulating interlayer pattern 160 and the isolation layer 110 adjacent to the outermost gate structure 200 may be prevented in the field region (B).

Figure 8:
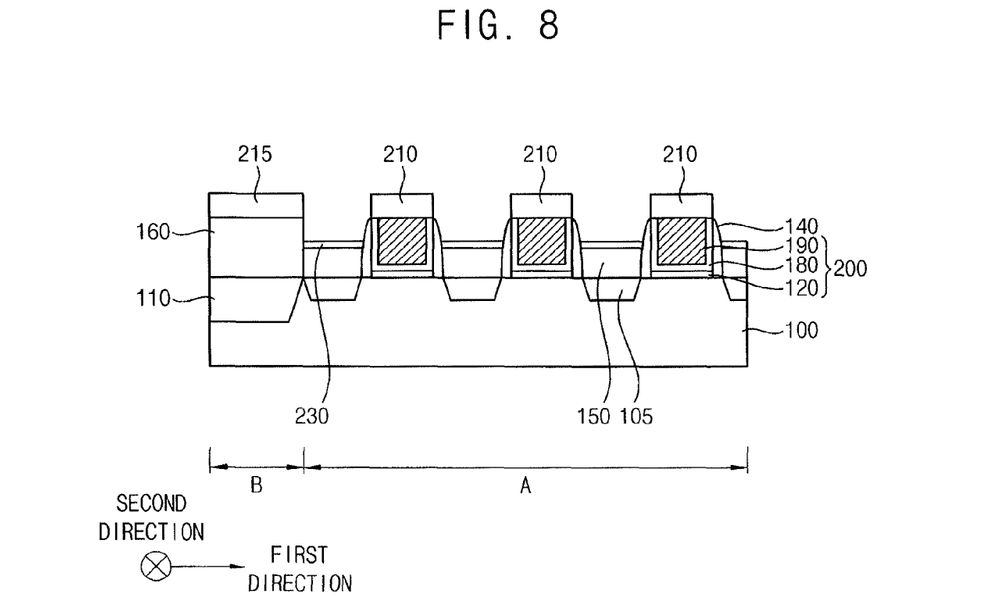

Referring to FIG. 8, metal silicide patterns 230 may be formed on the ESD layers 150 exposed by the first openings 220. In example embodiments, a metal silicide layer (not illustrated) may be formed on the ESD layers 150 by thermally treating a metal layer (not illustrated) positioned on the ESD layers 150 after forming the metal layer on the ESD layers 150, the gate spacers 140, the first capping layer patterns 210 and the second capping layer pattern 215. The metal silicide patterns 230 may be formed on the ESD layers 150 by removing unreacted portions of the metal layer from the gate spacers 140, the first capping layer patterns 210 and the second capping layer pattern 215. The metal layer may be formed using nickel, platinum, cobalt, titanium, tungsten, etc. Further, the metal silicide patterns 230 may include nickel silicide ($NiSi_x$), platinum silicide ($PtSi_x$), cobalt silicide ($CoSi_x$), titanium silicide ($TiSi_x$), tungsten silicide ($WSi_x$), etc.

Figure 9:
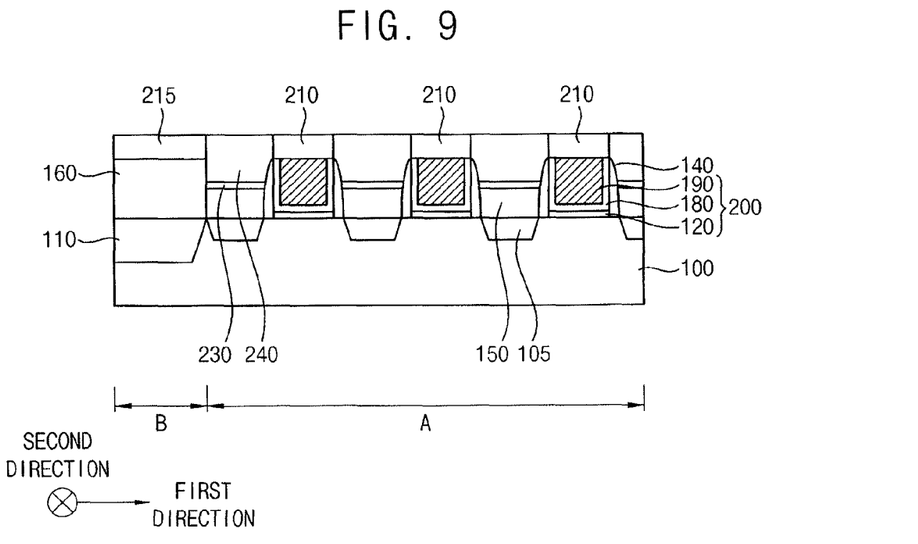

Referring to FIG. 9, second insulating interlayer patterns 240 may be formed on the metal silicide patterns 230 to fill the first openings 220. The second insulating interlayer patterns 240 may completely fill the first openings 220.

In example embodiments, an insulation layer (not illustrated) having a thickness sufficiently filling the first openings 220 may be formed on the metal silicide patterns 230, the gate spacers 140, the first capping layer patterns 210 and the second capping layer pattern 215. The insulation layer may be partially removed until the first and the second capping layer patterns 210 and 215 are exposed, so that the second insulating interlayer patterns 240 may be provided on the metal silicide patterns 230. Each of the second insulating interlayer patterns 240 may include a material having a relatively high etching selectivity with respect to the first and the second capping layer patterns 210 and 215. For example, the second insulating interlayer patterns 240 may be formed using silicon oxide.

Figure 10:
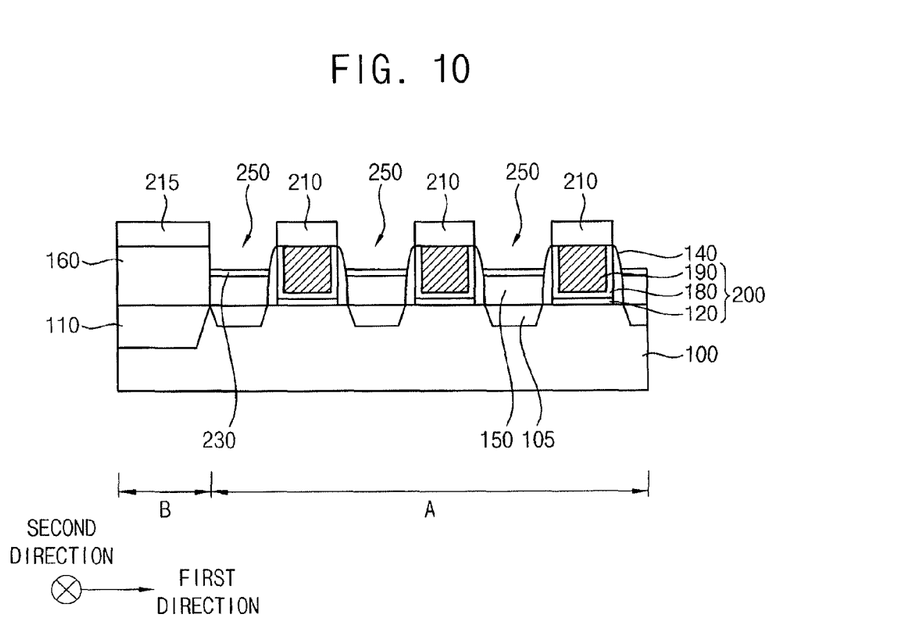

Referring to FIGS. 1 and 10, the second insulating interlayer patterns 240 may be partially removed by a photolithography process to form second openings 250 partially exposing the metal silicide patterns 230 in the active region (A). The gate spacers 140 may be partially exposed by the second openings 250.

In example embodiments, photoresist patterns (not illustrated) may be formed on the second insulating interlayer patterns 240, the first capping layer patterns 210 and the second capping layer pattern 215, and then the second insulating interlayer patterns 240 may be partially removed using the photoresist patterns as etching masks. The photoresist patterns may expose the second insulating interlayer patterns 240 and may also expose the first and the second capping layer patterns 210 and 215. When each of the first and the second capping layer patterns 210 and 215 includes a material, for example, silicon nitride, having an etching selectivity with respect to the second insulating interlayer patterns 240, the first and the second capping layer patterns 210 and 215 may remain after partially removing the second insulating interlayer patterns 240. Thus, a process margin of a process for forming the second openings 250 may be ensured.

When the gate spacers 140 include silicon nitride having an etching selectivity relative to the second insulating interlayer patterns 240, the second openings 250 may be self-aligned with respect to the gate spacers 140, the first capping layer patterns 210 and/or the second capping layer pattern 215.

The first insulating interlayer pattern 160 on the isolation layer 110 adjacent to the outermost gate structure 200 may not be etched while forming the second openings 250. The first insulating interlayer pattern 160 in the field region (B) may be protected by the second capping layer pattern 215.

Figure 11:
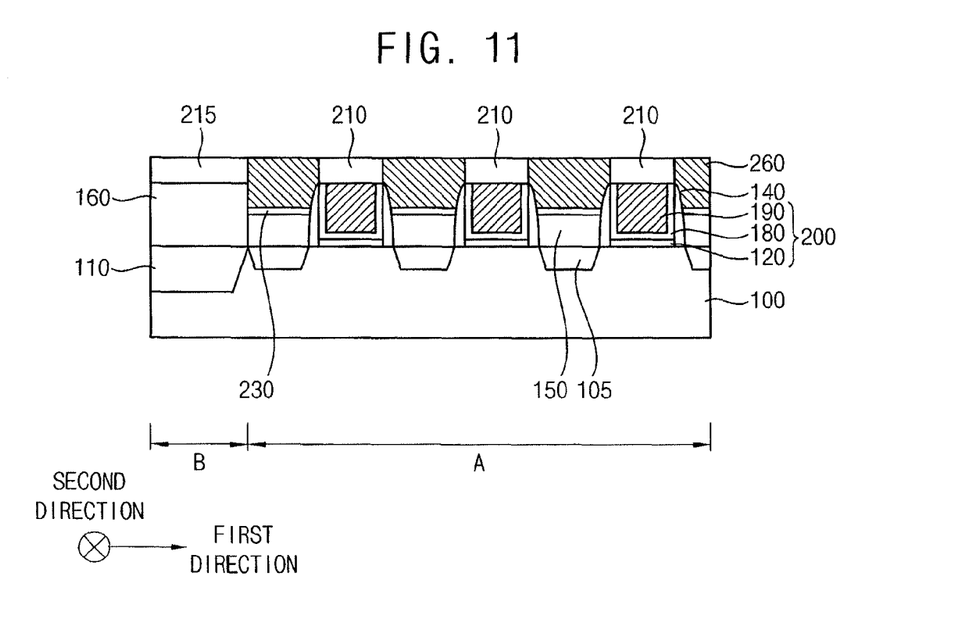

Referring to FIGS. 1 and 11, conductive structures 260 including plugs or pads may be formed on the metal silicide patterns 230 to fill the second openings 250, respectively.

In example embodiments, at least one conductive layer (not illustrated) having a thickness sufficiently filling the second openings 250 may be formed on the metal silicide patterns 230, the gate spacers 140, the first and the second capping layer pattern 215. The at least one conductive layer may be partially removed until the first and the second capping layer patterns 210 and 215 are exposed. Thus, the conductive structures 260 may be provided on the metal silicide patterns 230, respectively. For example, the conductive layer may be formed using polysilicon doped with impurities, metal, metal nitride, etc.

According to example embodiments, the second openings 250 may be self-aligned relative to the gate spacers 140, the first capping layer patterns 210 and/or the second capping layer pattern 215. Therefore, the conductive structures 260 filling the second openings 250 may also be self-aligned with respect to the gate spacers 140, the first capping layer patterns 210 and/or the second capping layer pattern 215.

In some example embodiments, before forming the conductive structures 260 in the second openings 250, spacers (not illustrated) may be additionally formed on sidewalls of the first and the second capping layer patterns 210 and 215, the gate spacers 140, the remaining first insulating interlayer pattern 160 and the remaining second insulating interlayer patterns 240.

Figure 12:
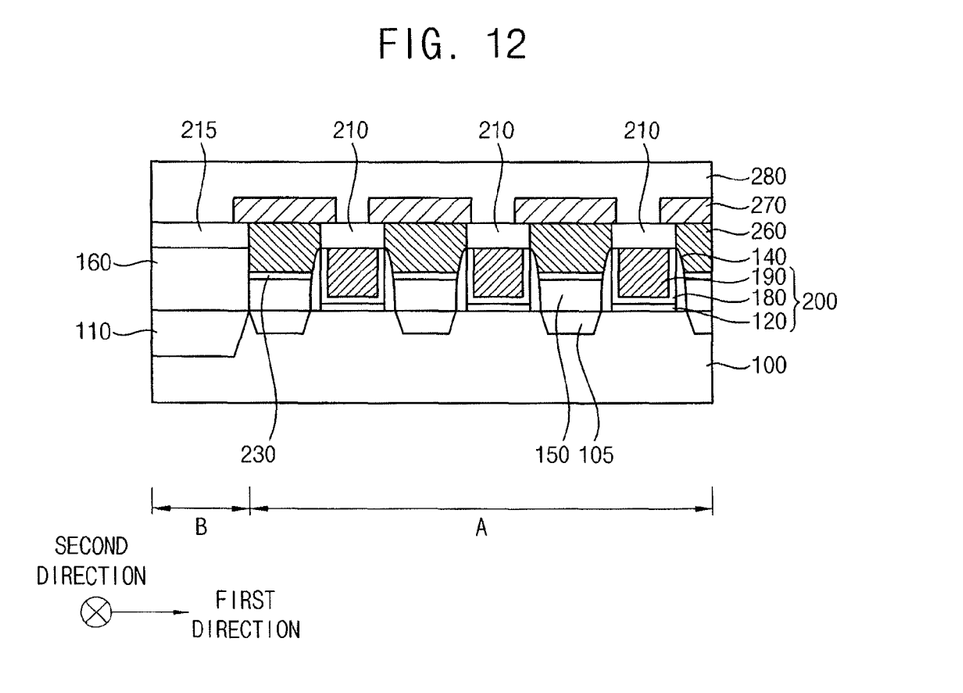

Referring to FIG. 12, wirings 270 electrically connected to the conductive structures 260 may be formed on the conductive structures 260 and portions of the first and the second capping layer patterns 210 and 215. Each of the wirings 270 may be formed using a metal and/or metal nitride. A protection layer 280 may be formed on the wirings 270, the first capping layer patterns 210 and the second capping layer pattern 215. The protection layer 280 may be formed using an oxide, nitride and/or oxynitride.

According to example embodiments, the semiconductor device may include the gate structures 200, the first capping layer patterns 210, the second capping layer pattern 215, the metal silicide patterns 230, and the conductive structures 260, which may be provided on the substrate 100 having the active region (A) and the field region (B) defined by the isolation layer 110. Further, the semiconductor device may include the second insulating interlayer patterns 240, the first insulating interlayer pattern 160, and the gate spacers 140. The second insulating interlayer patterns 240 may be positioned between adjacent gate structures 200. Upper faces of the second insulating interlayer patterns 240 and the gate structures 200 may be positioned on the substantially same plane. The first insulating interlayer pattern 160 may be positioned between the isolation layer 110 and the second capping layer pattern 215. The first insulating interlayer pattern 160 may have a height substantially the same as or substantially similar to that of each second insulating interlayer pattern 240. The first insulating interlayer pattern 160 may contact an adjacent second insulating interlayer pattern 240. The gate spacers 140 may be provided on the sidewalls of the gate structures 200, respectively.

In example embodiments, the active region (A) of the substrate 100 may have the substantially linear shape extending along the first direction, and each of the gate structures 200 may have the substantially linear shape extending along the second direction substantially perpendicular to the second direction. Each of the gate structures 200 including a metal may have the gate insulation layer pattern and the gate electrode 190 stacked on the substrate 100. In this case, the gate insulation layer pattern may include the low-k dielectric layer pattern 120 and the high-k dielectric layer pattern 180. The gate electrode 190 may include a metal.

In example embodiments, the first capping layer patterns 210 may extend in the second direction and may cover the gate structures 200. The second capping layer pattern 215 may extend along the second direction and may substantially overlap a an upper portion of the first insulating interlayer pattern 160 and a portion of the isolation layer 110 adjacent to the outermost gate structure 200 positioned in the active region (A).

In example embodiments, the metal silicide patterns 230 and the conductive structures 260 may be self-aligned with respect to the gate spacers 140, the first capping layer patterns 210 and/or the second capping layer pattern 215. Sidewalls of the metal silicide patterns 230 and the conductive structures 260 may be partially enclosed by the second insulating interlayer patterns 240. For example, the sidewalls of the metal silicide patterns 230 and the conductive structures 260 adjacent to the outermost gate structure 200 in the active region (A) may be partially enclosed by the first insulating interlayer pattern 160.

Each of the first and the second capping layer patterns 210 and 215 may include the material having an etching selectivity with respect to the first insulating interlayer pattern 160 and the second insulating interlayer patterns 240. For example, the first and the second capping layer patterns 210 and 215 may include silicon nitride, whereas the first and the second insulating interlayer patterns 160 and 240 may include silicon oxide.

By way of summation and review, a gate electrode may be formed in a semiconductor device using a metal. A metal gate electrode of a semiconductor device may be obtained by a damascene process. When a semiconductor device having a metal gate electrode is manufactured by a damascene process, the metal gate electrode may be formed on a substrate, and then a silicidation process and a process for forming a contact on the metal gate electrode may be executed. Thus, proper etching processes considering the metal gate electrode and the contact may be required to provide the metal gate electrode and the contact on the substrate, in order to ensure desired dimensions and electrical characteristics.

Embodiments disclosed herein provide a method of manufacturing a semiconductor device in which metal silicide patterns 230 and conductive structures 260 may be self-aligned relative to gate structures 200 and gate spacers 140 due to the presence of the first and the second capping layer patterns 210 and 215. The first capping layer patterns 210 may cover the gate structures 200 and the second capping layer pattern 215 may cover the first insulating interlayer pattern 160 adjacent to the outermost gate structure 200. Thus, damage to the isolation layer 110 may be prevented while the first and the second openings 220 and 250 for the metal silicide patterns 220 and the conductive structures 260 are formed. Therefore, the gate structures 200 and the conductive structures 260 may have improved electrical characteristics without leakage current toward the isolation layer 110.

Accordingly, example embodiments may provide a semiconductor device having gate structures including metal and conductive structured to ensure required dimensions and improved electrical characteristics, and may provide a method of manufacturing a semiconductor device having gate structures including metal and conductive structures to ensure desired dimensions and improved electrical characteristics Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, comprising:
    forming a plurality of gate structures including a metal on a substrate having an isolation layer;
    forming first insulating interlayer patterns covering sidewalls of the gate structures;
    forming first capping layer patterns and a second capping layer pattern on the gate structures and the first insulating interlayer patterns, the first capping layer patterns covering upper faces of the gate structures, and the second capping layer pattern overlapping the isolation layer;
    partially removing the first insulating interlayer patterns using the first and the second capping layer patterns as etching masks to form first openings that expose portions of the substrate;
    forming metal silicide patterns on the portions of the substrate exposed in the forming of the first openings; and
    forming conductive structures on the metal silicide patterns.

2. The method as claimed in claim 1, wherein:
    the substrate includes an active region and a field region, the field region being defined by the isolation layer, and
    the second capping layer pattern partially overlaps the isolation layer adjacent to an outermost gate structure in the active region.

3. The method as claimed in claim 2, wherein the active region has a linear shape extending in a first direction, each of the gate structures has a linear shape extending in a second direction perpendicular to the first direction, and each of the first and the second capping layer patterns has a linear shape extending in the second direction.

4. The method as claimed in claim 1, wherein:
the forming of the gate structures includes forming gate spacers on the sidewalls of the gate structures,
the first insulating interlayer patterns cover sidewalls of the gate spacers, and
the first openings are self-aligned relative to the gate spacers.

5. The method as claimed in claim 1, wherein:
the first insulating interlayer patterns are formed using silicon oxide, and
the first and the second capping layer patterns are formed using silicon nitride.

6. The method as claimed in claim 1, wherein the forming of the conductive structures includes:
forming second insulating interlayer patterns on the metal silicide patterns to fill the first openings;
partially removing the second insulating interlayer patterns to form second openings exposing the metal silicide patterns; and
forming the conductive structures on the metal silicide patterns to fill the second openings.

7. The method as claimed in claim 6, wherein:
the forming of the gate structures includes forming gate spacers on the sidewalls of the gate structures, and
the conductive structures are self-aligned relative to at least one of the gate spacers, the first capping layer patterns and the second capping layer pattern.

8. The method as claimed in claim 1, further comprising:
forming impurity regions at upper portions of the substrate beneath the metal silicide patterns, the first openings exposing the impurity regions; and
forming elevated source drain (ESD) layers between the impurity regions and the metal silicide patterns.

9. The method as claimed in claim 1, wherein the forming of the gate structures includes:
forming a plurality of dummy gate structures on the substrate;
forming a first insulating interlayer on the substrate to cover the dummy gate structures;
forming the first insulating interlayer patterns by partially removing the first insulating interlayer until the dummy gate structures are exposed;
partially removing the dummy gate structures to form recesses; and
forming gate electrodes including metal in the recesses.

10. The method as claimed in claim 9, wherein:
the dummy gate structures include low-k dielectric layer patterns and dummy gate electrodes, and
the recesses are formed by removing the dummy gate electrodes.

11. The method as claimed in claim 10, further comprising forming high-k dielectric layer patterns on the low-k dielectric layer patterns and sidewalls of the recesses prior to forming the gate electrodes including metal.

12. A method of manufacturing a semiconductor device, comprising:
providing a substrate, the substrate including a first region including an isolation layer and a second region including a plurality of dummy gates structures, the dummy gate structures each including a dummy gate electrode and gate spacers formed on sidewalls of the gate structures;
forming first insulation interlayer patterns in the first region and in the second region, one portion of the first insulation interlayer patterns covering the isolation layer and extending from the first region to cover a sidewall of a dummy gate structure closest to the first region, and remaining portions of the first insulation interlayer patterns extending between adjacent ones of the dummy gate structures and covering the sidewalls of adjacent gate structures;
removing the dummy gate electrodes from the dummy gate structures to form recesses bounded by the gate spacers, and filling the recesses with a metal to provide gate structures including a metal gate electrode;
forming first capping layer patterns on an upper surface of the gate structures in the second region to cover each of the gate structures and a second capping layer pattern on the one portion of the first insulating interlayer patterns in the first region to overlap the isolation layer, wherein the first capping layer patterns expose portions of the first insulating interlayer patterns extending between adjacent ones of the gate structures and the second capping layer pattern exposes a portion of the first insulating interlayer patterns between the first region and a sidewall of the gate structure closest to the first region,
partially removing the first insulating interlayer patterns using the first and the second capping layer patterns as etching masks to form first openings that expose portions of the substrate between adjacent ones of the gate structures and between the first region and the sidewall of the gate structure closest to the first region, the first openings being self-aligned relative to at least one of the gate spacers and wherein the one portion of the first insulating interlayer patterns covering the isolation layer is not removed;
forming metal silicide patterns on the portions of the substrate exposed in the forming of the first openings; and
forming conductive structures on the metal silicide patterns, wherein the conductive structures are self-aligned relative to at least one of the gate spacers.

13. The method as claimed in claim 12, wherein the forming of the conductive structures includes:
forming second insulating interlayer patterns on the metal silicide patterns to fill the first openings;
partially removing the second insulating interlayer patterns to form second openings exposing the metal silicide patterns; and
forming the conductive structures on the metal silicide patterns to fill the second openings.

14. The method as claimed in claim 12, wherein:
the dummy gate structures include low-k dielectric patterns and
the method further includes forming high-k dielectric layer patterns on the low-k dielectric layer patterns after removing the dummy gate electrodes from the dummy gate structures to form the recesses and before filling the recesses with the metal to provide the gate structures.

15. The method as claimed in claim 12, further comprising forming impurity regions at upper portions of the substrate between the dummy gate electrode structures and forming elevated source drain (ESD) layers on the impurity regions before forming the first insulating interlayer patterns.

* * * * *